United States Patent
Saito

(10) Patent No.: US 10,227,183 B2
(45) Date of Patent: Mar. 12, 2019

(54) CONVEYANCE APPARATUS

(71) Applicant: Senju Metal Industry Co., Ltd., Tokyo (JP)

(72) Inventor: Yuta Saito, Saitama (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 15/828,603

(22) Filed: Dec. 1, 2017

(65) Prior Publication Data

US 2018/0155135 A1 Jun. 7, 2018

(30) Foreign Application Priority Data

Dec. 5, 2016 (JP) ................... 2016-235705

(51) Int. Cl.
*B65G 25/10* (2006.01)
*B65G 47/49* (2006.01)
(Continued)

(52) U.S. Cl.
CPC .......... *B65G 47/5127* (2013.01); *B23K 1/002* (2013.01); *B23K 1/008* (2013.01); *B23K 1/0008* (2013.01); *B23K 1/0016* (2013.01); *B23K 1/203* (2013.01); *B23K 3/087* (2013.01); *B65G 15/20* (2013.01); *B65G 25/10* (2013.01); *B65G 47/49* (2013.01); *H01L 21/67* (2013.01); *H01L 21/6704* (2013.01); *H01L 21/677* (2013.01);
(Continued)

(58) Field of Classification Search
CPC ... B23K 1/0008; B23K 1/002; B65G 47/5127

USPC ...... 198/444, 464.1, 464.2, 464.3, 572, 575, 198/576; 414/222.11, 217, 940
See application file for complete search history.

(56) References Cited

U.S. PATENT DOCUMENTS 5,228,558 A * 7/1993 Hall .......................... H02P 5/50
198/571
6,039,316 A * 3/2000 Jackson ................. B65H 5/066
271/194

(Continued)

FOREIGN PATENT DOCUMENTS

CN 102301840 A 12/2011
CN 102714923 A 10/2012
(Continued)

*Primary Examiner* — Douglas A Hess
(74) *Attorney, Agent, or Firm* — The Webb Law Firm

(57) ABSTRACT

A soldering apparatus as a conveyance apparatus includes a substrate loading portion to load a substrate on the soldering apparatus, an intermittent feeding unit to intermittently feed the substrate loaded on the soldering apparatus, a substrate discharge portion to discharge the intermittently fed substrate to the outside of the soldering apparatus and a controller to control conveyance of the substrate. The substrate loading portion includes a first conveyance path to convey the substrate, a first sensor provided in the vicinity of a substrate loading inlet of the substrate loading portion, and a second sensor arranged in a downstream side of the first sensor along the substrate conveyance direction. The intermittent feeding unit includes a second conveyance path for conveying the substrate, and a third sensor placed in the vicinity of an upstream end of the intermittent feeding unit along the substrate conveyance direction.

20 Claims, 10 Drawing Sheets

(51) Int. Cl.

| | |
|---|---|
| *B65G 47/82* | (2006.01) |
| *B65G 47/51* | (2006.01) |
| *B23K 1/002* | (2006.01) |
| *B23K 1/00* | (2006.01) |
| *B23K 1/008* | (2006.01) |
| *B23K 1/20* | (2006.01) |
| *B23K 3/08* | (2006.01) |
| *H01L 21/67* | (2006.01) |
| *H01L 21/677* | (2006.01) |
| *H05K 3/34* | (2006.01) |
| *B65G 15/20* | (2006.01) |
| *B23K 101/42* | (2006.01) |

(52) U.S. Cl.
CPC .. *H01L 21/67028* (2013.01); *H01L 21/67138* (2013.01); *H01L 21/67144* (2013.01); *H01L 21/67276* (2013.01); *H01L 21/67294* (2013.01); *H01L 21/67766* (2013.01); *H01L 21/67778* (2013.01); *H05K 3/3494* (2013.01); *B23K 2101/42* (2018.08); *B65G 47/82* (2013.01); *B65G 2203/0233* (2013.01)

(56) References Cited

U.S. PATENT DOCUMENTS

| | | | |
|---|---|---|---|
| 6,053,234 A | 4/2000 | Kim et al. | |
| 6,240,335 B1 * | 5/2001 | Wehrung | G05B 19/4182 |
| | | | 198/571 |
| 6,594,546 B2 | 7/2003 | Elger | |
| 6,799,709 B2 | 10/2004 | Takaguchi et al. | |
| 6,854,583 B1 * | 2/2005 | Horn | B65G 49/064 |
| | | | 198/346.2 |
| 6,887,358 B2 * | 5/2005 | Elger | H01L 21/67276 |
| | | | 134/61 |
| 7,151,980 B2 * | 12/2006 | You | G06Q 10/08 |
| | | | 700/214 |
| 7,280,889 B2 * | 10/2007 | Knepple | B65G 37/02 |
| | | | 198/460.1 |
| 7,284,652 B2 * | 10/2007 | Zeitler | B65G 47/52 |
| | | | 198/370.02 |
| 7,360,638 B2 * | 4/2008 | Ko | G05B 19/414 |
| | | | 198/575 |
| 7,413,069 B2 * | 8/2008 | Brill | H01L 21/67276 |
| | | | 198/349 |
| 7,705,742 B1 * | 4/2010 | Delaney, III | H01R 4/2404 |
| | | | 198/460.1 |
| 7,798,758 B2 * | 9/2010 | Bufano | H01L 21/67376 |
| | | | 414/222.01 |
| 8,186,563 B2 | 5/2012 | Sugihara et al. | |
| 8,757,363 B2 * | 6/2014 | Combs | B65G 43/10 |
| | | | 198/781.01 |
| 9,114,936 B2 | 8/2015 | Yokota | |
| 9,193,529 B2 | 11/2015 | Yokota | |
| 9,214,372 B2 * | 12/2015 | Sahoda | H01L 21/67051 |
| 9,484,234 B2 * | 11/2016 | Reichenbach | H01L 21/67706 |
| 9,505,560 B2 * | 11/2016 | Kleinikkink | G05B 19/00 |
| 2006/0219275 A1 | 10/2006 | Weber et al. | |
| 2017/0282270 A1 | 10/2017 | Kagaya | |

FOREIGN PATENT DOCUMENTS

| | | |
|---|---|---|
| CN | 104444129 A | 3/2015 |
| CN | 205441882 U | 8/2016 |
| JP | 563165 A | 1/1981 |
| JP | 1174632 A | 3/1999 |
| JP | 2003188517 A | 7/2003 |
| JP | 2005199286 A | 7/2005 |
| JP | 2007242833 A | 9/2007 |
| JP | 201650572 A | 4/2016 |
| KR | 1019990052615 A | 7/1999 |
| WO | 2010084785 A1 | 7/2010 |
| WO | 2013031739 A1 | 3/2013 |
| WO | 2013031740 A1 | 3/2013 |
| WO | 2016035703 A1 | 3/2016 |

\* cited by examiner

CONVEYANCE APPARATUS

CROSS REFERENCE TO RELATED APPLICATION

The present invention contains subject matter related to Japanese Patent Application JP 2016-235705 filed in the Japanese Patent Office on Dec. 5, 2016, the entire contents of which being incorporated herein by reference.

TECHNICAL FIELD

The present invention relates to a conveyance apparatus, and it relates, for example, to a soldering apparatus capable of soldering a surface mount device or the like on a substrate.

BACKGROUND ART

In general, a soldering apparatus for soldering the substrate includes processing units such as pre-heating portion, a soldering portion, a cooling portion and a pair of conveyance paths for conveying the substrate.

JP 2003-188517 A discloses a soldering apparatus for soldering by sliding a printed circuit board on rails along a fluxer, a pre-heater, and a jet solder bath with a pusher. WO 2013/031739 and WO 2013/031740 disclose conveyance apparatuses each having a conveyance rod that reciprocates along a conveyance path and a pusher piece that abuts on or recedes from the substrate by rotating the conveyance rod around a shaft.

SUMMARY OF THE INVENTION

Issue to be Addressed

However, in the case of the soldering apparatus disclosed in JP 2003-188517 A and the conveyance apparatuses disclosed in WO 2013/031739 and WO 2013/031740, a substrate newly loaded on the apparatus may be continuously conveyed even when a substrate previously loaded on the conveyance apparatus has been a standby state, so that the substrates may collide with each other. If the substrates collide with each other, an object to be mounted on the substrate may be deviated from its correct mount position, or a soldering defect may occur.

The present invention addresses the above-described issue and has an object to provide a conveyance apparatus capable of controlling conveyance of a substrate depending on presence of the substrate on the standby state.

Means for Addressing Issue

In order to address the aforementioned issue, the invention provides the following technical means:

(1) A conveyance apparatus that conveys a substrate, contains a substrate loading portion configured to load the substrate on the conveyance apparatus, an intermittent feeding unit configured to intermittently feed the substrate loaded on the conveyance apparatus, a substrate discharge portion configured to discharge the intermittently fed substrate to the outside of the conveyance apparatus, and a controller configured to control conveyance of the substrate, said substrate loading portion, said intermittent feeding unit, said substrate discharge portion being arranged from an upstream side to a downstream side along a substrate conveyance direction, wherein the substrate loading portion having a substrate loading inlet includes a first conveyance path configured to convey the substrate, a first sensor provided in the vicinity of the substrate loading inlet thereof, and a second sensor arranged in a downstream side of the first sensor along the substrate conveyance direction, and wherein the intermittent feeding unit having an upstream end along the substrate conveyance direction includes a second conveyance path for conveying the substrate, and a third sensor placed in the vicinity of the upstream end thereof.

(2) In the conveyance apparatus described in item (1), the controller controls conveyance of the substrate using the first conveyance path and the second conveyance path by determining a position of the substrate depending on presence of the substrate detected by the first, second, and third sensors.

(3) In the conveyance apparatus described in item (2), the first conveyance path includes a pusher configured to push the substrate conveyed on the first conveyance path to the second conveyance path.

(4) In the conveyance apparatus described in item (3), when the third sensor detects a preceding substrate out of the substrates conveyed by the conveyance apparatus, and the second sensor detects a front end of a following substrate, the controller suspends conveyance of the following substrate.

(5) In the conveyance apparatus described in item (3), when the first sensor does not detect the following substrate, the second sensor detects the following substrate, and the third sensor does not detect the preceding substrate, the controller drives the pusher.

(6) In the conveyance apparatus described in item (1), the intermittent feeding unit includes a fourth sensor placed in an upstream side of the third sensor along the substrate conveyance direction, and the controller determines that the substrate is placed in a normal position when the third sensor detects the substrate, and the fourth sensor does not detect the substrate.

(7) In the conveyance apparatus described in any one of items (1) to (6), the intermittent feeding unit includes a pair of conveyance claws configured to press the substrate.

(8) In the conveyance apparatus described in item (7), the intermittent feeding unit includes a third conveyance path in a downstream side of the second conveyance path along the substrate conveyance direction, and the substrate discharge portion includes a fourth conveyance path.

(9) In the conveyance apparatus described in any one of items (1) to (8), the intermittent feeding unit includes at least a chamber for performing a process in a sealed space.

(10) In the conveyance apparatus described in any one of items (1) to (7), the intermittent feeding unit includes a pre-heating portion configured to pre-heat the substrate, a main heating portion configured to solder the pre-heated substrate, a vacuum deaerating portion having a vacuum chamber for vacuum deaeration for the soldered substrate, and a cooling portion configured to cool the substrate subjected to the vacuum deaeration.

(11) In the conveyance apparatus described in item (8), the intermittent feeding unit includes a pre-heating portion configured to pre-heat the substrate, a main heating portion configured to solder the pre-heated substrate, a vacuum deaerating portion having a vacuum chamber for vacuum deaeration for the soldered substrate, and a cooling portion configured to cool the substrate subjected to the vacuum deaeration, wherein the pre-heating portion contains the second conveyance path, and the conveyance claw configured to press the substrate conveyed on the second conveyance path, the main heating portion is provided in the downstream side of the second conveyance path along the substrate conveyance direction, and the cooling portion has the third conveyance path.

In the conveyance apparatus according to this invention, it is possible to control the intermittent feeding operation for substrates (hereinafter, referred to as a tact-transferring) loaded on the substrate loading portion of the conveyance apparatus depending on presence of an immediately preceding substrate loaded on the conveyance apparatus.

Other objects and attainments of the present invention will be become apparent to those skilled in the art upon a reading of the following detailed description when taken in conjunction with the drawings.

EMBODIMENTS FOR CARRYING OUT THE INVENTION

The following will describe embodiments of a soldering apparatus 100 as one example of a conveyance apparatus according to the present invention with reference to the attached drawings. Note that, hereinafter, an "upstream" refers to a substrate loading inlet 11 side where a substrate $P_{(n)}$ is loaded on the soldering apparatus 100, and a "downstream" refers to a substrate discharge outlet 12 side where the substrate $P_{(n)}$ is discharged from the soldering apparatus 100. In addition, hereinafter, a front end of the substrate $P_{(n)}$ refers to a downstream end of the substrate $P_{(n)}$, and a rear end of the substrate $P_{(n)}$ refers to an upstream end of the substrate $P_{(n)}$.

[Whole Configuration of Soldering Apparatus 100]

Figure 1:
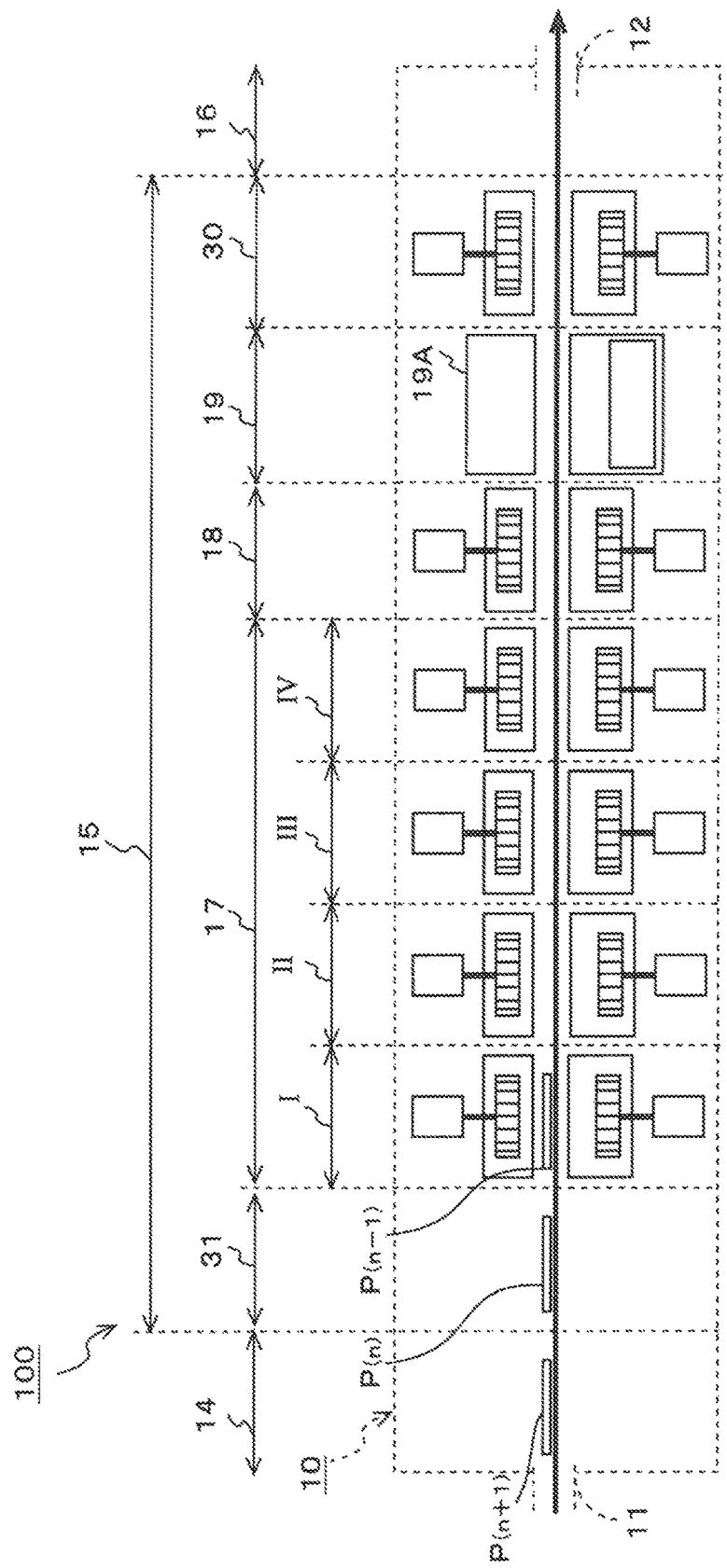
FIG. 1 is a cross-sectional view illustrating a configuration example of a soldering apparatus 100 according to an embodiment of the invention.
Figure 2:
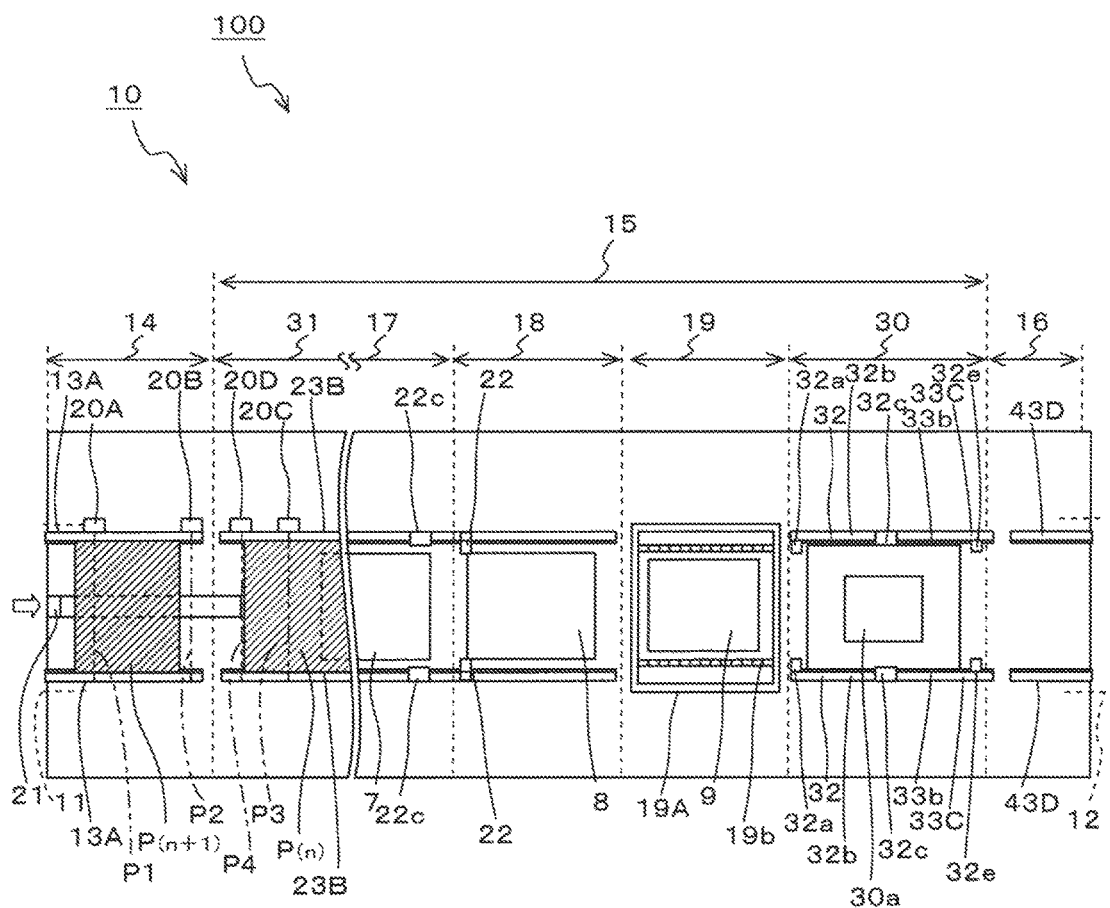
FIG. 2 is a schematic top plan view illustrating a configuration example of the soldering apparatus 100 according to an embodiment of the invention.

As illustrated in FIG. 1, the soldering apparatus 100 deaerates, for example, a substrate $P_{(n)}$ where a surface mount device such as a power device is mounted under a vacuum atmosphere. The soldering apparatus 100 has each processing unit inside a main unit 10 which is an opened casing. The main unit 10 has, on its both end walls, a substrate loading inlet 11 for loading the substrate $P_{(n)}$ in the main unit 10 and a substrate discharge outlet 12 for discharging the substrate $P_{(n)}$ from the main unit 10. As illustrated in FIG. 2, the main unit 10 includes conveyance paths 13A, 23B, 33C, and 43D for conveying the substrate $P_{(n)}$. The conveyance paths 13A, 23B, 33C, and 43D are arranged in series from the substrate loading inlet 11 to the substrate discharge outlet 12.

As illustrated in FIG. 1, the main unit 10 has, for example, a plurality of rooms (zones) partitioned in series along a conveyance direction of the substrate $P_{(n)}$. Specifically, the main unit 10 includes a substrate loading portion 14, a pre-heating portion 17 provided with four zones I to IV, a main heating portion 18 provided with a single zone, a vacuum deaerating portion 19, a cooling portion 30, and a substrate discharge portion 16, which are arranged in this order from the upstream side to the downstream side along the conveyance direction. According to this embodiment, an intermittent feeding start portion 31 serving as a reference position for intermittently feeding the substrates $P_{(n)}$ is provided between the substrate loading portion 14 and the zone I of the pre-heating portion 17. Since the substrates $P_{(n)}$ are intermittently fed along the intermittent feeding start portion 31, the pre-heating portion 17, the main heating portion 18, the vacuum deaerating portion 19, and the cooling portion 30, these components will be referred to as an intermittent feeding unit 15. In order to intermittently feed the substrates $P_{(n)}$, each zone from the intermittent feeding start portion 31 to the cooling portion 30 is spaced equidistantly. In this example, the distance is set to 400 mm.

Figure 6:
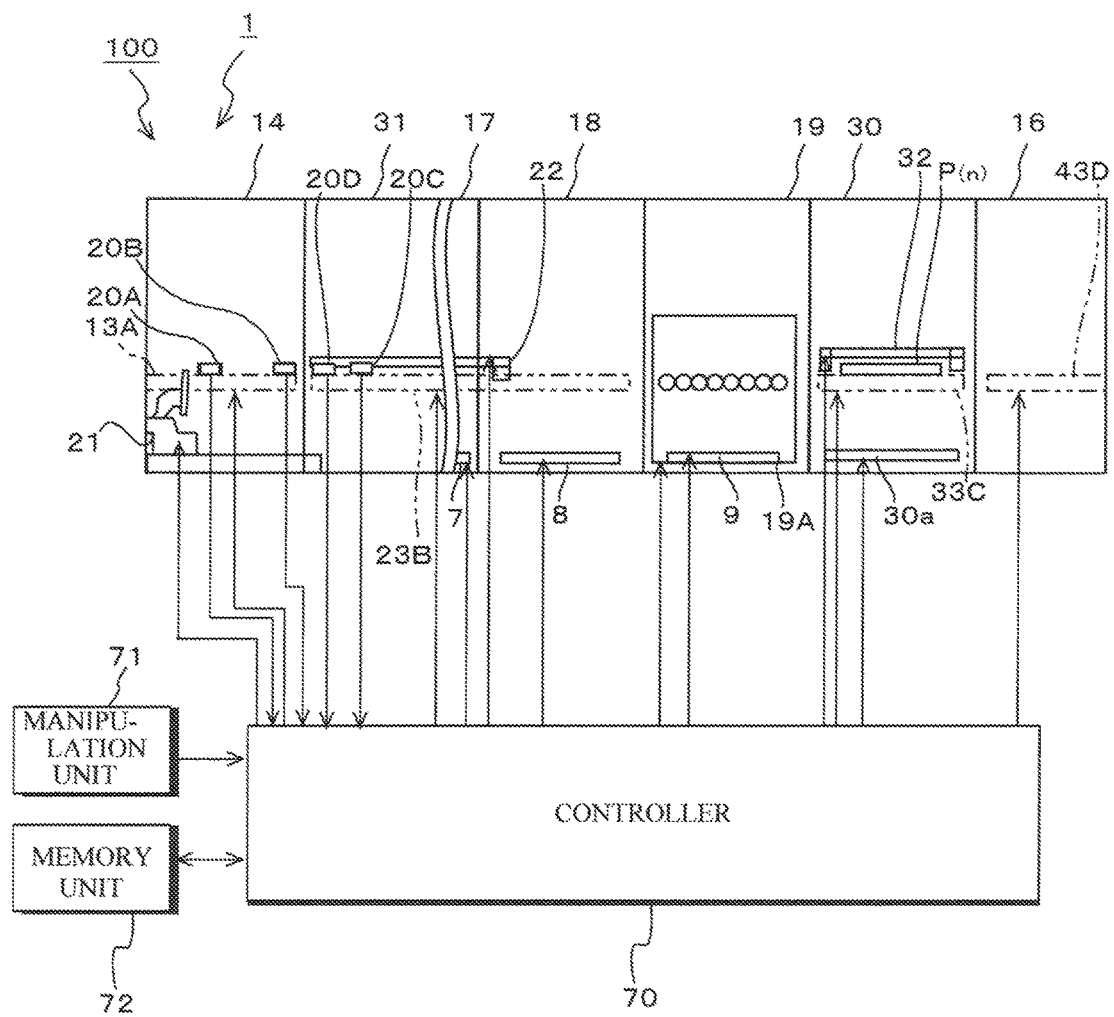
FIG. 6 is a block diagram illustrating a control system of the soldering apparatus 100.

The main unit 10 internally has a controller 70 for controlling operations of respective portions as illustrated in FIG. 6. An inert gas as an atmospheric gas for preventing oxidization of the solder is supplied to the main unit 10. Note that, in this embodiment, a vacuum chamber 19A serving as a vacuum deaerating portion 19 for performing vacuum deaeration for the substrate $P_{(n)}$ in a sealed space has a predetermined thickness for generating vacuum. Considering this thickness, in this embodiment, a maximum length of the substrate $P_{(n)}$ in the conveyance direction is set to 300 mm, and a maximum length of the width direction perpendicular to the conveyance direction is set to 250 mm.

Note that clocking for the intermittent feeding starts when the first substrate $P_{(1)}$ reaches the intermittent feeding start portion 31. The substrate $P_{(1)}$ is conveyed to the next zone after a predetermined time (referred to as a cycle time) elapses. Then, regardless of a state of the substrate loading portion 14, the intermittent feeding unit 15 conveys the substrate $P_{(n)}$ to the next zone at a predetermined time interval. Meanwhile, the substrate loading portion 14 detects a situation in which there is no preceding substrate $P_{(n-1)}$ in the intermittent feeding start portion 31 in the vicinity of the upstream end of the conveyance path 23B and conveys the loaded substrate $P_{(n)}$ to the intermittent feeding start portion 31 as described below.

For this reason, depending on a timing for loading the substrate on the substrate loading portion 14, a timing for conveying the substrate $P_{(n)}$ on the substrate loading portion 14 and an intermittent feeding timing may be deviated, so that the substrate $P_{(n)}$ fed to the intermittent feeding start portion 31 may be conveyed to the next zone while the aforementioned predetermined time does not elapse.

For this reason, in this embodiment, the intermittent feeding start portion 31 serves as a buffering zone for securing a predetermined time for subsequent zones. Although this embodiment has such a configuration, alternatively, another buffering zone for securing a predetermined time may be provided between the intermittent feeding start portion 31 and the zone I of the pre-heating portion 17 in order to secure a predetermined time in the zone before the substrate $P_{(n)}$ is conveyed to the pre-heating portion 17. Alternatively, the zone I of the pre-heating portion 17 may be set as the intermittent feeding start portion 31. Various configurations may also be conceived in this manner.

Figure 3:
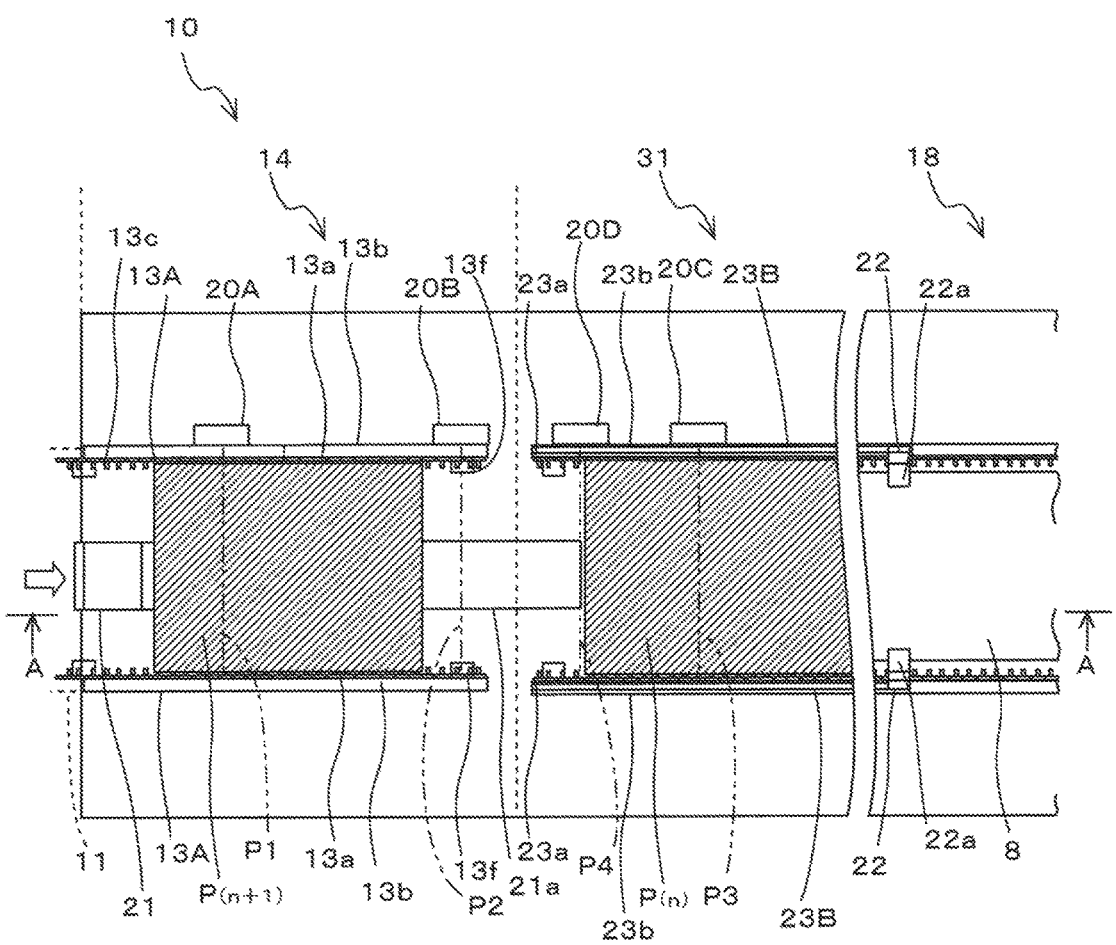
FIG. 3 is a top plan view illustrating a configuration example of a substrate loading portion 14, an intermittent feeding start portion 31, and a main heating portion 18.

As illustrated in FIG. 3, the substrate loading portion 14 includes a conveyance path 13A as a first conveyance path for conveying the substrate $P_{(n)}$, a sensor 20A as a first sensor provided in the vicinity of the substrate loading inlet 11 of the conveyance path 13A, a sensor 20B as a second sensor arranged in a downstream side of the sensor 20A of the conveyance path 13A, a pusher 21 that pushes the substrate $P_{(n)}$ to the downstream side, and a drive mechanism (not shown) that drives the pusher 21.

Figure 4:
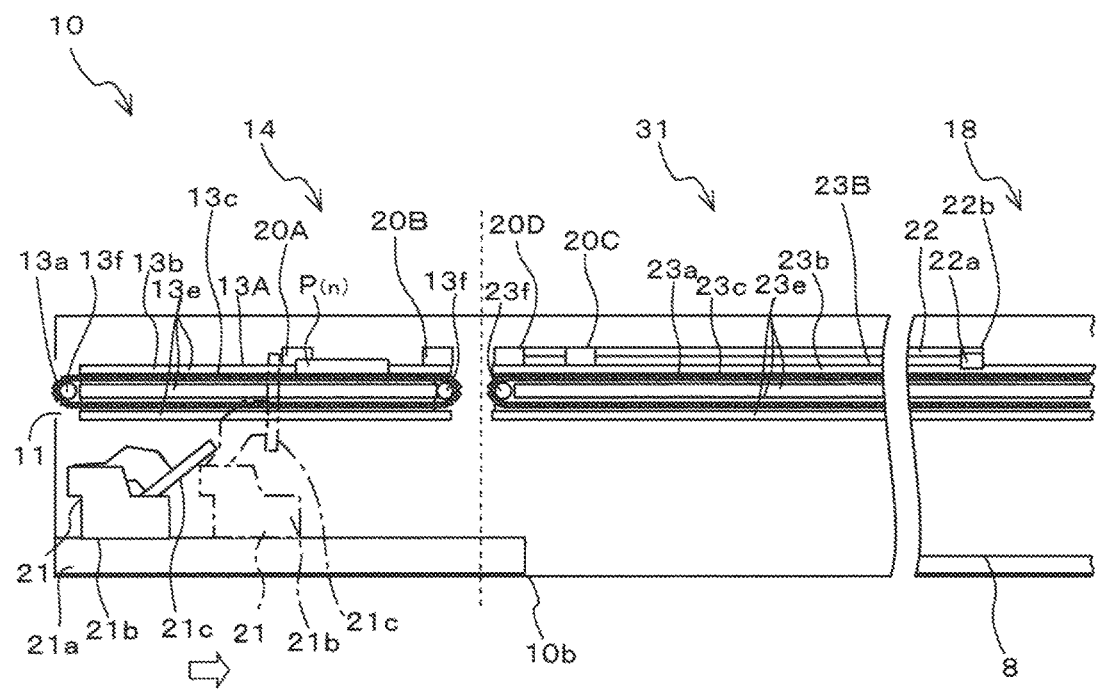
FIG. 4 is a cross-sectional view taken along lines A-A of FIG. 3 to illustrate a configuration example of the substrate loading portion 14, the intermittent feeding start portion 31, and the main heating portion 18.

The conveyance path 13A is arranged from the substrate loading inlet 11 to the downstream end of the substrate loading portion 14. On the conveyance path 13A, the substrate $P_{(n)}$ fed from the substrate loading inlet 11 to the main unit 10 is conveyed to a void arrow direction of the drawing. As illustrated in FIG. 4, the conveyance path 13A includes a pair of conveyance chains 13a, support portions 13b, each of which supports the conveyance chain 13a in the main unit 10, and chain drive portions 13f, each of which rotatably drives the conveyance chain 13a. A pair of conveyance chains 13a has protrusions 13c. The pair of conveyance chains 13a is arranged such that the protrusions 13c face each other. The protrusions 13c support both ends of the substrate $P_{(n)}$ from the bottom.

The conveyance chain 13a is linked in a loop shape. The support portion 13b has a plurality of protrusions 13e protruding from the inside of the main unit 10. As the conveyance chain 13a is inserted into a gap between the protrusions 13e, the support portion 13b supports the conveyance chain 13a linked in a loop shape from the inside and the outside of the loop. According to this embodiment, the support portion 13b has three protrusions 13e. The chain drive portion 13f meshes with the conveyance chain 13a at the upstream end and the downstream end inside the conveyance chain 13a linked in a loop shape.

As illustrated in FIG. 3, the pusher 21 is installed slidably on rails 21a arranged in parallel with the conveyance path 13A. The rails 21a are provided between the pair of conveyance chains 13a of the conveyance path 13A. The rails 21a extend from the upstream end of the substrate loading portion 14 to the upstream end of the intermittent feeding start portion 31. As illustrated in FIG. 4, the rails 21a are installed in a bottom surface 10b of the main unit 10.

As illustrated in FIG. 4, the pusher 21 includes a deck portion 21b and a pushing portion 21c rotatably installed in the deck portion 21b. The pusher 21 in an initial state has a sleep state (receding from the conveyance path 13A of the substrate $P_{(n)}$ such that the pushing portion 21c does not hinder conveyance of the substrate in the deck portion 21b as indicated by the solid line in the drawing. As a drive mechanism (not shown) drives the pusher 21, the deck portion 21b moves from the upstream side to the downstream side, and accordingly, the pushing portion 21c is rotated counterclockwise in FIG. 4, so that the pushing portion 21c is erected from the deck portion 21b to protrude upward to the height of the substrate $P_{(n)}$ as indicated by a one-dotted chain line in the drawing. Then, as indicated by the void arrow in the drawing, as the pusher 21 further moves from the upstream side to the downstream side, the substrate $P_{(n)}$ placed in the downstream end of the conveyance path 13A is pushed to the second conveyance path 23B. The pusher 21 is set to move at a constant stroke.

The sensor 20A is a contactless sensor. The sensor 20A is installed over the support portion 13b. The sensor 20A detects presence of the substrate $P_{(n)}$ at the same position as that of the sensor 20A along the conveyance direction of the substrate $P_{(n)}$ as indicated in the substrate reference position P1 by a two-dotted chain line in FIG. 2. When there is the substrate $P_{(n)}$ in the substrate reference position P1, the sensor 20A is set to ON. When there is no substrate $P_{(n)}$ in the substrate reference position P1, the sensor 20A is set to OFF. When a signal of the sensor 20A changes from OFF to ON, the substrate $P_{(n)}$ is loaded on the substrate loading portion 14, and it is detected that a front end of the substrate $P_{(n)}$ passes through the substrate reference position P1. When the signal of the sensor 20A changes from ON to OFF, it is detected that a rear end of the substrate $P_{(n)}$ passes through the substrate reference position P1.

As illustrated in FIG. 4, the sensor 20B is arranged over the support portion 13b in the vicinity of the downstream end of the conveyance path 13A. The sensor 20B is a contactless sensor. The sensor 20B detects presence of the substrate $P_{(n)}$ in the same position as that of the sensor 20B along the conveyance direction of the substrate $P_{(n)}$ as indicated in the substrate reference position P2 by a two-dotted chain line in FIG. 2. The sensor 20B is set to ON when there is the substrate $P_{(n)}$ in the substrate reference position P2. The sensor 20B is set to OFF when there is no substrate $P_{(n)}$ in the substrate reference position P2. That is, while the sensor 20B has the ON state, it is detected that the substrate $P_{(n)}$ is located in the vicinity of the downstream end of the substrate loading portion 14. Specifically, when a signal of the sensor 20B changes from OFF to ON, it is detected that a front end of the substrate $P_{(n)}$ reaches the substrate reference position P2. In addition, when the signal of the sensor 20B changes from ON to OFF, it is detected that a rear end of the substrate $P_{(n)}$ passes through the substrate reference position P2.

As illustrated in FIG. 2, out of the configuration of the intermittent feeding unit 15, the intermittent feeding start portion 31, the pre-heating portion 17, and the main heating portion 18 are provided with a conveyance path 23B as a second conveyance path for conveying the substrate $P_{(n)}$, a pair of conveyance claws 22 that pushes the substrate $P_{(n)}$ fed to the main heating portion 18 to the vacuum deaerating portion 19, and a sensor 20C as a third sensor provided in the vicinity of the upstream end of the conveyance path 23B.

The pre-heating portion 17 is provided with a heater 7 for heating the substrate $P_{(n)}$ to a predetermined temperature. The pre-heating portion 17 preferably increases the heating temperature of the substrate $P_{(n)}$ in a stepwise manner. The pre-heating portion 17 may have a plurality of pre-heating zones each having different heating temperatures. For example, when the substrate $P_{(n)}$ is desired to have a temperature of 180° C., as illustrated in FIG. 1, four pre-heating zones I to IV may be provided to set the heating temperature of the heater 7 in the pre-heating zones to 150° C., 160° C., 170° C., and 180° C., respectively. In each zone I to IV of the pre-heating portion 17 of this embodiment, a gas (hot air) heated by the heater 7 is blasted to the substrate $P_{(n)}$ using a fan to heat the substrate $P_{(n)}$.

As illustrated in FIG. 3, the conveyance path 23B is arranged to extend from the upstream end of the intermittent feeding start portion 31 to the downstream end of the main heating portion 18 via the heater 7 along the substrate conveyance direction. The conveyance path 23B has the same configuration as that of the conveyance path 13A and includes a pair of conveyance chains 23a having protrusions 23c, support portions 23b, each of which supports the conveyance chain 23a in the main unit 10, and chain drive portions 23f, each of which rotatably drives the conveyance chain 23a as illustrated in FIG. 4. The conveyance path 23B intermittently conveys the substrate $P_{(n)}$ pushed by the pusher 21 from the conveyance path 13A from the upstream side of the intermittent feeding start portion 31 to the downstream side of the main heating portion 18 via the pre-heating portion 17 as indicated by the void arrow in the drawing.

Figure 5:
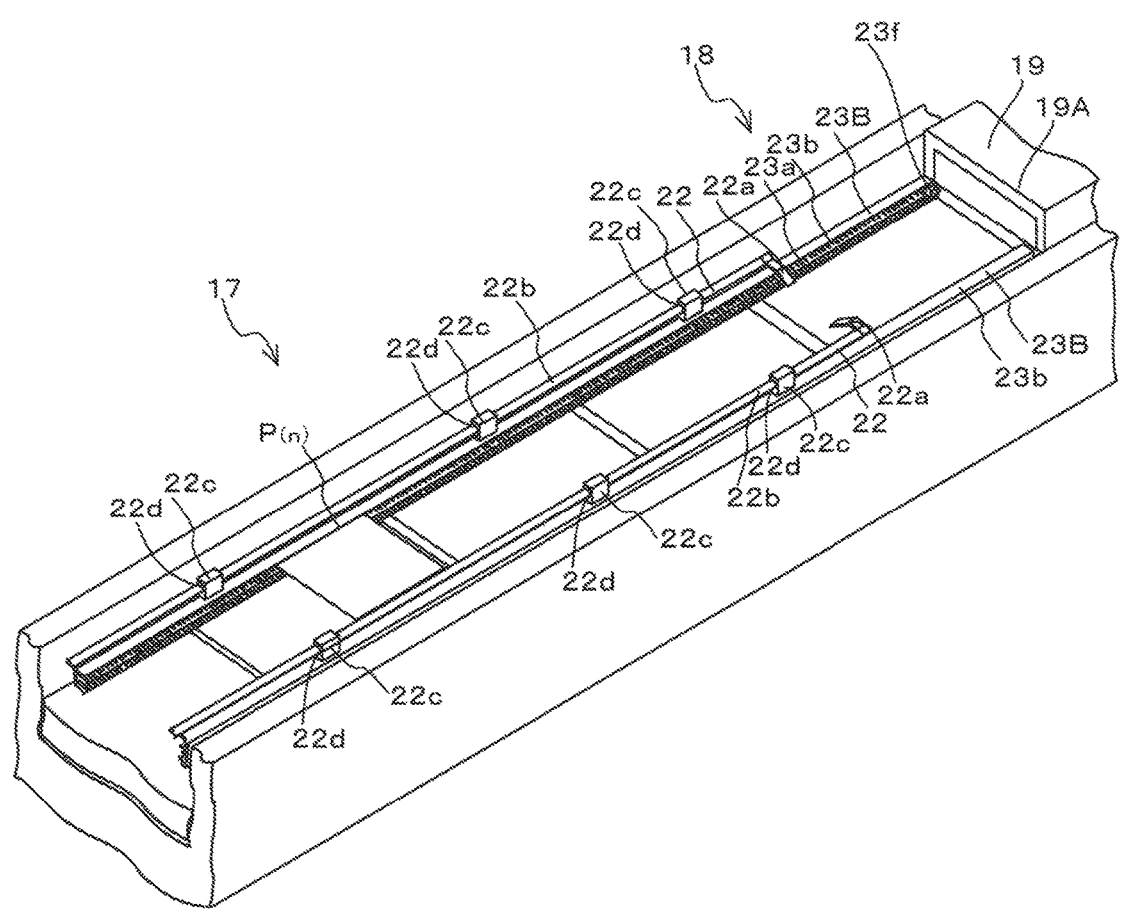
FIG. 5 is a perspective view illustrating a configuration example of a pre-heating portion 17 and the main heating portion 18.

As illustrated in FIG. 5, the conveyance claws 22 are respectively supported by a pair of support portions 23b of the conveyance path 23B. Each of the conveyance claws 22 has a claw portion 22a, a shaft portion 22b for sliding and rotating the claw portion 22a, a shaft support portion 22c that supports the shaft portion 22b on the support portion 23b, and a drive mechanism (not shown) for sliding and rotating the shaft portion 22b. According to this embodiment, three shaft support portions 22c are provided on each of the pair of support portions 23b. The shaft support portion 22c has a hole 22d, and the shaft portion 22b is inserted into the hole 22d. The claw portion 22a is preferably provided in the vicinity of the downstream end of the shaft portion 22b. The claw portion 22a is a plate member extending perpendicularly to the conveyance direction of the substrate $P_{(n)}$ from the shaft portion 22b, and is bent at a predetermined location.

In the conveyance claws 22 at an initial position, the claw portions 22a are located in the upstream side of the standby position of the substrate $P_{(n)}$ of the main heating portion 18. In this case, the claw portions 22a avoid the substrate $P_{(n)}$ upward, that is, recede from the conveyance path 23B of the substrate $P_{(n)}$ such that they do not make contact with a rear end of the conveyed substrate $P_{(n)}$. When the conveyance claws 22 press the substrate $P_{(n)}$, first, the shaft portions 22b rotate so that the claw portions 22a are located inside the conveyance path of the substrate $P_{(n)}$. In this case, the rear end of the substrate $P_{(n)}$ is placed in the standby position in the downstream side of the claw portions 22a. Then, as the shaft portions 22b slide from the upstream side to the downstream side, the claw portions 22a are engaged with the rear end of the substrate $P_{(n)}$ and further push the substrate $P_{(n)}$, so that the claw portions 22a push the substrate $P_{(n)}$ toward the vacuum chamber 19A. As the claw portions 22a press the substrate $P_{(n)}$, the substrate $P_{(n)}$ is conveyed to a plurality of support rollers 19b of the vacuum chamber 19A illustrated in FIG. 2. As the operation of pressing the substrate $P_{(n)}$ with the claw portions 22a is completed, the shaft portions 22b are shifted to the upstream direction (in a direction spaced from the rear end of the substrate $P_{(n)}$ to upstream side), and the claw portions 22a rotate to recede from the substrate conveyance path. After the claw portions 22a avoid the substrate $P_{(n)}$, the conveyance claws 22 return to the initial position.

The operation of pressing the substrate $P_{(n)}$ using the claw portions 32a and 32e of the other conveyance claws 32 described below is similar to those of the claw portions 22a. That is, during the pressing operation on the substrate $P_{(n)}$, the claw portions 32a and 32e are fetched to the substrate conveyance path using a drive mechanism (not shown) in the upstream position which is slightly distant from the substrate $P_{(n)}$, and then, the rear end of the substrate $P_{(n)}$ is engaged with the claw portions 32a and 32e to convey the substrate $P_{(n)}$. In addition, as the intermittent feeding conveyance is terminated, the claw portions 32a and 32e recede from the conveyance path in the upstream position which is slightly distant from the substrate $P_{(n)}$. In the following description, the operation for the claw portions 22a, 32a, and 32e of the conveyance claws 22 and 32 and substrate $P_{(n)}$ will not be repeatedly described for convenience purposes.

As illustrated in FIG. 3, the sensor 20C is installed over the support portion 23b in the downstream side of the upstream end of the conveyance chain 23a and in the vicinity of the upstream end of the conveyance path 23B. The sensor 20C is a contactless sensor. The sensor 20C detects presence of a substrate $P_{(n)}$ in the same position as that of the sensor 20C along the conveyance direction of the substrate $P_{(n)}$ as indicated in a substrate reference position P3 by a two-dotted chain line in FIG. 2. The sensor 20C is set to ON when there is substrate $P_{(n)}$ in the substrate reference position P3. The sensor 20C is set to OFF when there is no substrate $P_{(n)}$ in the substrate reference position P3. When a signal of the sensor 20C has the ON state, it is detected that a substrate $P_{(n)}$ is placed in the vicinity of the upstream end of the conveyance path 23B. Specifically, when the signal of the sensor 20C changes from OFF to ON, it is detected that a front end of the substrate $P_{(n)}$ reaches the substrate reference position P3. In addition, when the signal of the sensor 20C changes from ON to OFF, it is detected that a rear end of the substrate $P_{(n)}$ passes through the substrate reference position P3.

In this embodiment, as illustrated in FIG. 3, a sensor 20D as a fourth sensor is provided in the upstream end of the conveyance path 23B in the upstream side of the sensor 20C. The sensor 20D is a contactless sensor. The sensor 20D detects presence of a substrate $P_{(n)}$ in the same position as that of the sensor 20D along the conveyance direction of the substrate $P_{(n)}$ as indicated in the substrate reference position P4 by a two-dotted chain line in the drawing. The sensor 20D is set to ON when there is a substrate $P_{(n)}$ in the substrate reference position P4. The sensor 20D is set to OFF when there is no substrate $P_{(n)}$ in the substrate reference position P4. When a signal of the sensor 20D has the ON state, it is detected that the substrate $P_{(n)}$ is placed in the upstream end of the conveyance path 23B. Specifically, when the signal of the sensor 20D changes from OFF to ON, it is detected that a front end of the substrate $P_{(n)}$ passes through the upstream end of the intermittent feeding start portion 31. In addition, when the signal of the sensor 20D changes from ON to OFF, it is detected that a rear end of the substrate $P_{(n)}$ passes through the upstream end of the intermittent feeding start portion 31.

Therefore, it is possible to reliably detect whether or not the substrate $P_{(n)}$ conveyed to the intermittent feeding start portion 31 is placed in a predetermined position (normal position) by cooperatively using the sensors 20C and 20D when the sensor 20C is set to ON, and the sensor 20D is set to OFF. In this normal position, the rear end of the substrate $P_{(n)}$ is placed between the substrate reference positions P3 and P4 as in the substrate $P_{(n)}$ of FIG. 2. This normal position is set to be the substrate standby position A. This substrate standby position A is also a position where the substrate $P_{(n)}$ is fetched by the pusher 21 from the substrate loading portion 14 to the intermittent feeding start portion 31.

Note that, if both the sensors 20C and 20D have the ON state even after the timing at which the substrate $P_{(n)}$ starts to be conveyed from the intermittent feeding start portion 31 to the next zone, it is determined that there is no substrate $P_{(n)}$ in the normal position, and an operator is notified of abnormality using an alarm sound or the like. This is because there may be an issue in the open or close operation of the vacuum chamber 19A of the vacuum deaerating portion 19 if the intermittent feeding is continuously performed while there is no substrate $P_{(n)}$ in the normal position.

As a positional relationship between the first, second, and third sensors 20A, 20B, and 20C, a distance between the sensors 20A and 20C is set to a length exceeding an applicable maximum length of the substrate $P_{(n)}$ in the conveyance direction. In this embodiment, since the maximum length of the substrate $P_{(n)}$ in the conveyance direction is set to 300 mm, the distance between the sensors 20A and 20C is set to 320 mm. This setting is to prevent the sensors 20A, 20B, and 20C from changing to the ON state at the same time. Then, the sensor 20B is provided between the sensors 20A and 20C. In this embodiment, the sensors 20A and 20B are arranged equidistantly, and the sensors 20B and 20C are arranged equidistantly. Note that, in order to detect that the substrate $P_{(n)}$ is placed in a predetermined position of the intermittent feeding start portion 31, the sensor 20D is provided between the sensors 20B and 20C, and the distance between the sensors 20A and 20D is set to 240 mm.

As illustrated in FIG. 2, the main heating portion 18 has a heater 8 for heating the solder to its melting temperature or higher to solder the substrate $P_{(n)}$ heated by the pre-heating portion 17. The heater 8 has a heating temperature set to approximately 250° C. by way of example. The vacuum deaerating portion 19 is provided with a vacuum chamber 19A that performs vacuum deaeration during the soldering on the substrate $P_{(n)}$, a heater 9 provided inside the vacuum chamber 19A, and a plurality of support rollers 19b that support the substrate $P_{(n)}$ upward of the heater 9 from the bottom. The vacuum chamber 19A is preferably a casing having a lid opened or closed perpendicularly to the substrate $P_{(n)}$ along the conveyance direction of the substrate $P_{(n)}$. The heater 9 has a heating temperature set to approximately 250° C. which is nearly equal to that of the main heating portion 18. The support rollers 19b are follower rollers operated to follow the conveyance of the substrate $P_{(n)}$. The support rollers 19b are a pair of rollers arranged in the downstream end from the upstream end within the inner wall of the vacuum chamber 19A along the conveyance direction of the substrate $P_{(n)}$.

The cooling portion 30 is provided with a cooling fan as an example of a cool air blower for cooling the substrate $P_{(n)}$, a conveyance path 33C as a third conveyance path for conveying the substrate $P_{(n)}$, and a pair of conveyance claws 32 that pushes the substrate $P_{(n)}$. Note that, although the cooling fan 30a is controlled in an ON/OFF manner in this embodiment, a cooling time may be arbitrarily set by an operator depending on a product. In addition, the temperature may be managed using a means such as a chiller to cool the substrate $P_{(n)}$ to a predetermined temperature. Even in this case, the cooling temperature may be arbitrarily set by an operator.

The conveyance path 33C is arranged to extend from the upstream end of the cooling portion 30 to the downstream end of the cooling portion 30 via the cooling fan 30a. The conveyance path 33C is formed of the same material as that of the conveyance path 13A and includes a pair of conveyance chains 33a each having protrusions 33c (not shown), support portions 33b that support the conveyance chains 33a inside the main unit 10, and chain drive portions 33f that rotatably drives the conveyance chains 33a. The conveyance path 33C conveys the substrate $P_{(n)}$ from the upstream end of the cooling portion 30 to the downstream end thereof along the void arrow direction of the drawing.

The conveyance claws 32 are respectively supported on a pair of support portions 33b of the conveyance path 33C. Each of the conveyance claws 32 has claw portions 32a and 32e, a shaft portion 32b for sliding and rotating the claw portions 32a and 32e, a shaft support portion 32c that supports the shaft portion 32b on the support portion 33b, and a drive mechanism (not shown) for sliding and rotating the shaft portion 32b. The claw portion 32a is preferably provided in the vicinity of the upstream end of the shaft portion 32b, and the claw portion 32e is preferably provided in the vicinity of the downstream end of the shaft portion 32b. Similar to the claw portion 22a of the conveyance claw 22, the claw portions 32a and 32e are plate members each extending perpendicularly from the shaft portion 32b along the conveyance direction of the substrate $P_{(n)}$, and the claw portions 32a and 32e are bent in a predetermined position.

In the conveyance claws 32 at an initial position, the claw portions 32a are located in the vicinity of the upstream end of the cooling portion 30, and the claw portions 32e are located in the vicinity of the downstream end of the cooling portion 30. A distance between the claw portions 32a and 32e is set to 400 mm which is the intermittent feeding length. Each claw portion 32a of the conveyance claw 32 presses a rear end of the substrate $P_{(n)}$ placed in the vacuum deaerating portion 19 up to the upstream end of the cooling portion 30. Each claw portion 32e of the conveyance claw 32 presses a rear end of the substrate $P_{(n-1)}$ placed in the cooling portion 30 up to the upstream end of the substrate discharge portion 16. In the initial position of each of the conveyance claws 32, the claw portions 32a and 32e avoid the substrate upward (recede from the conveyance path of the substrate) so as not to make contact with the conveyed substrates $P_{(n)}$ and $P_{(n-1)}$. When the conveyance claws 32 press the rear ends of the substrates, first, the claw portions 32a and 32e recede from the conveyance paths of the substrates $P_{(n)}$ and $P_{(n-1)}$, respectively. In this state, the shaft portions 32b slide to the upstream direction and move further to the upstream side from positions where the rear end of the substrate $P_{(n)}$ placed in the chamber and the claw portions 32a are engaged, and the rear end of the substrate $P_{(n-1)}$ placed in the cooling portion 30 and the claw portions 32e are engaged. Then, as the shaft portions 32b rotate, the claw portions 32a and 32e are respectively rotated around the shaft portions 32b and are placed in the positions spaced from the rear ends of the substrate $P_{(n)}$ and $P_{(n-1)}$ inside the conveyance path of the substrates $P_{(n)}$ and $P_{(n-1)}$. Then, as the shaft portions 32b slide to the downstream side, the shaft portions 32b slide from the upstream side to the downstream side while the claw portions 32a and 32e support the rear ends of the substrates $P_{(n)}$ and $P_{(n-1)}$. As a result, the substrates $P_{(n)}$ and $P_{(n-1)}$ are pressed. When the operation of pressing the substrates $P_{(n)}$ and $P_{(n-1)}$ of the claw portions 32a and 32e is completed, the shaft portions 32b move to the upstream side (to a direction spaced from the rear ends of the substrates $P_{(n)}$ and $P_{(n-1)}$. Then, as the shaft portions 32b rotate, the claw portions 32a and 32e are rotated, so that the claw portions 32a and 32e receded in the conveyance path of the substrates $P_{(n)}$ and $P_{(n-1)}$ return to the initial position where the substrates $P_{(n)}$ and $P_{(n-1)}$ are avoided.

The substrate discharge portion 16 has a conveyance path 43D as a fourth conveyance path for conveying a substrate $P_{(n)}$. The conveyance path 43D is arranged to extend from the upstream end of the substrate discharge portion 16 to the substrate discharge outlet 12 of the downstream end. The conveyance path 43D has the same configuration as that of the conveyance path 13A and includes a pair of conveyance chains 43a each having protrusions 43c (not shown), support portions 43b, each of which supports the conveyance chain 43a inside the main unit 10, and chain drive portions 43f, each of which rotatably drives the conveyance chain 43a.

The conveyance path 43D is driven to a direction of discharging the substrate $P_{(n)}$ at all times regardless of presence of the substrate $P_{(n)}$. The conveyance path 43D conveys the substrate $P_{(n)}$ along the void arrow direction of the drawing and discharges the substrate $P_{(n)}$ from the substrate discharge outlet 12 to the outside of the soldering apparatus 100.

As illustrated in FIG. 6, the controller 70 is connected to the conveyance paths 13A, 23B, 33C, and 43D, the sensors 20A to 20D, the pusher 21, the conveyance claws 22 and 32, the heaters 7 and 8, the vacuum chamber 19A, the cooling fan 30a, a manipulation unit 71, and a memory unit 72. The manipulation unit 71 includes a liquid crystal display panel, a keypad, or the like. As the operator operates the manipulation unit 71, the controller 70 controls conveyance speeds of the conveyance paths 13A, 23B, 33C, and 43D, a timing for conveying the substrate $P_{(n)}$, the temperatures of the heaters 7 and 8, ON/OFF of the cooling fan 30a, a vacuum level or a vacuuming time of the vacuum chamber 19A, ON/OFF of the pusher 21 and the conveyance claws 22 and 32, and the like. The memory unit 72 stores information input from the manipulation unit 71, commands of the controller 70, an operation time of the soldering apparatus 100, and the like.

Subsequently, an operation example of the conveyance paths 13A, 23B, 33C, and 43D, the pusher 21, and the conveyance claws 22 and 32 in response to detection signals of the sensors 20A to 20D will be described with reference to FIGS. 7A to 9. It is assumed that an operator performs various settings on the manipulation unit 71, and each part is operated by the controller 70.

First, an operation example of the soldering apparatus 100 will be described with reference to FIGS. 7A and 7B.

At a step s1, the operator activates the soldering apparatus 100.

At a step s2, the pair of conveyance chains 13a and 43a is driven in response to the activation of the soldering apparatus 100.

At a step s3, a first substrate $P_{(1)}$ is placed on the protrusions 13c of the pair of conveyance chains 13a. The pair of protrusions 13c supports both ends of the substrate $P_{(1)}$ from the bottom.

At a step s4, the controller 70 controls the operation of the conveyance path 13A to convey the first substrate $P_{(1)}$. The control for the operation of the conveyance path 13A using the controller 70 will be described below in more details.

At a step s5, the controller 70 conveys the first substrate $P_{(1)}$ to the intermittent feeding start portion 31 of the intermittent feeding unit 15, that is, to the conveyance path 23B as a second conveyance path using the conveyance chains 23a and the pusher 21. The pusher 21 conveys the substrate $P_{(1)}$ to the substrate standby position A of the intermittent feeding start portion 31 at a constant stroke. In this case, since the conveyance path 23B as a second conveyance path is not driven yet, the first substrate $P_{(1)}$ conveyed to the conveyance path 23B becomes a substrate standby state.

At a step s6, the controller 70 determines whether or not a predetermined time elapses after the first substrate $P_{(1)}$ is conveyed to the substrate standby position A. After the first substrate $P_{(1)}$ is conveyed to this substrate standby position A, clocking of a predetermined time starts. Then, the clocking is continuously performed until the operation of the soldering apparatus 100 stops regardless of whether or not there is a substrate $P_{(n)}$ in the substrate standby position A. That is, the clocking starts as the soldering apparatus 100 is activated and the first substrate $P_{(1)}$ is conveyed to the substrate standby position A. Then, the intermittent feeding operation starts at a predetermined time and is continuously performed until the soldering apparatus 100 stops regardless of presence of the substrate $P_{(n)}$ in the substrate standby position A.

Note that the clocking for the intermittent feeding operation starts after the first substrate $P_{(1)}$ reaches the substrate standby position A of the intermittent feeding start portion 31 as described above, and the substrate $P_{(1)}$ is conveyed to the next zone after a predetermined time elapses. Then, the intermittent feeding unit 15 performs an operation of conveying the substrate $P_{(n)}$ to the next zone at a predetermined time interval regardless of the state of the substrate loading portion 14.

At a step s7, if a predetermined time elapses after the first substrate $P_{(1)}$ is conveyed to the substrate standby position A, the controller 70 starts the intermittent feeding operation for the first substrate $P_{(1)}$ using the conveyance path 23B as a second conveyance path.

At a step s8, the controller 70 intermittently feeds the first substrate $P_{(1)}$ to each of the zones I to IV of the pre-heating portion 17 using the conveyance path 23B, and pre-heating is executed for each zone. Note that, although the conveyance path 23B repeats driving and stopping operations at a predetermined time interval in this embodiment, the intermittent feeding operation may be performed by driving the conveyance path 23B at all times, providing a stopper for stopping and restarting conveyance of the substrate $P_{(n)}$ in each zone, and operating the stopper at a predetermined time interval.

At a step s9, the controller 70 intermittently feeds the first substrate $P_{(1)}$ to the main heating portion 18 using the conveyance path 23B and executes main heating.

At a step s10, the controller 70 drives the conveyance claws 22 after a predetermined time. The conveyance claws 22 support and press a rear end of the first substrate $P_{(1)}$ placed in the main heating portion 18 using the claw portions 22a, and conveys the first substrate $P_{(1)}$ to the support rollers 19b of the next vacuum deaerating portion 19. As the first substrate $P_{(1)}$ enters the vacuum chamber 19A, the lid of the vacuum chamber 19A is closed, and deaeration is processed under a vacuum atmosphere.

At a step s11, as the vacuum deaeration process is completed, the lid of the vacuum chamber 19A is opened. The conveyance claws 32 slide, and the claw portions 32a enter into the vacuum deaerating portion 19. The shaft portions 32b slide until the claw portions 32a are located in the vicinity of the upstream end inside the vacuum chamber 19A. Then, the shaft portions 32b respectively rotate, and the claw portions 32a support the rear end of the first substrate $P_{(1)}$. The claw portions 32a press the rear end of the first substrate $P_{(1)}$, and the first substrate $P_{(1)}$ is conveyed to the conveyance chains 33a of the cooling portion 30. As the operation of pressing the first substrate $P_{(1)}$ using the claw portions 32a is completed, the shaft portions 32b respectively rotate, and the claw portions 32a avoid the substrate $P_{(n)}$.

At a step s12, the first substrate $P_{(1)}$ conveyed to the cooling portion 30 is cooled. In this case, the conveyance chains 33a are not driven.

At a step s13, after a predetermined time elapses, the claw portions 32e of the conveyance claws 32 support the rear end of the first substrate $P_{(1)}$ and push the substrate $P_{(1)}$ to the conveyance path 43D of the substrate discharge portion 16.

In this case, the first substrate $P_{(1)}$ may be pushed to the conveyance path 43D of the substrate discharge portion 16 using the conveyance chains 33a instead of the claw portions 32e of the conveyance claws 32.

At a step s14, the first substrate $P_{(1)}$ conveyed to the conveyance path 43D using the claw portions 32e of the conveyance claws 32 or the conveyance chains 33a is conveyed using the conveyance path 43D of the substrate discharge portion 16 and is discharged from the substrate discharge outlet 12 to the outside of the soldering apparatus 100.

Figure 7A:
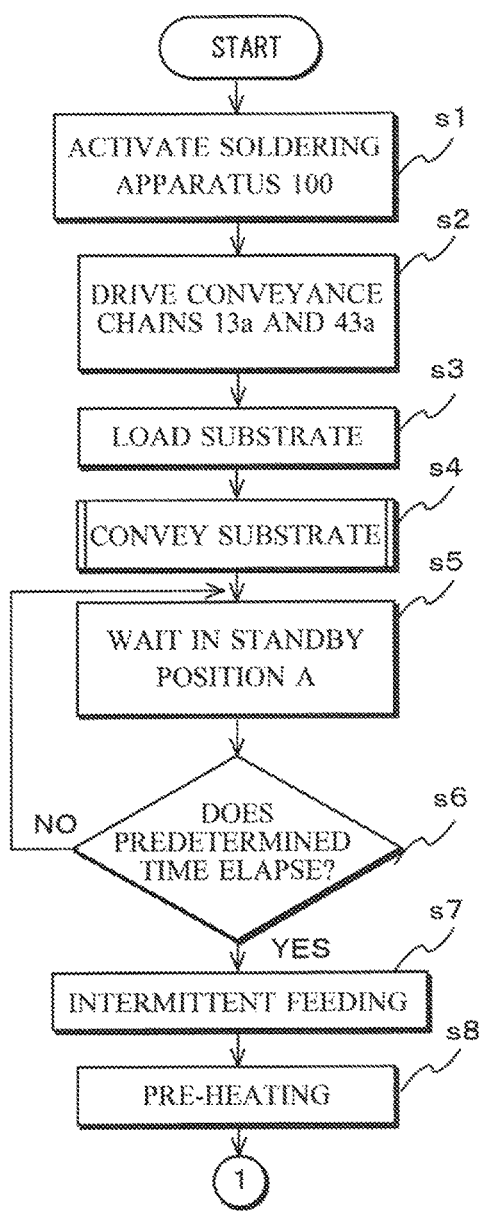
FIG. 7A is a flowchart illustrating an operation example of the soldering apparatus 100.
Figure 7B:
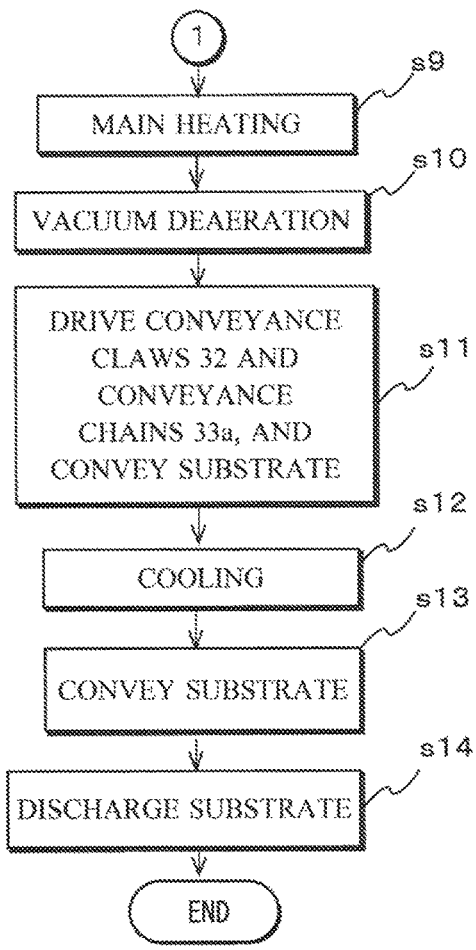
FIG. 7B is a flowchart illustrating the operation example of the soldering apparatus 100.

Meanwhile, the steps s3, s4, and s7 to s14 of FIGS. 7A and 7B are performed for the second and subsequent substrates $P_{(n)}$.

If the substrate $P_{(n)}$ is loaded on the soldering apparatus 100 in the step s3, the substrate loading portion 14 conveys the loaded substrate $P_{(n)}$ to the intermittent feeding start portion 31 at the step s4 by detecting that there is no preceding substrate $P_{(n-1)}$ in the intermittent feeding start portion 31 as described below.

Steps s7 to s14 for the substrate $P_{(n)}$ are similar to the steps s7 to s14 for the first substrate $P_{(1)}$. That is, in the steps s7 and s8, the controller 70 intermittently feeds the substrate $P_{(n)}$ sequentially to the intermittent feeding start portion 31 and each of the zones I to IV of the pre-heating portion 17 using the conveyance path 23B, and pre-heating is executed for each zone.

In the step s9, the controller 70 intermittently feeds the substrate $P_{(n)}$ to the main heating portion 18 using the conveyance path 23B and executes main heating.

In the step s10, the controller 70 drives the conveyance claws 22 at a predetermined time interval. The conveyance claws 22 support and press a rear end of the substrate $P_{(n)}$ placed in the main heating portion 18 using the claw portions 22a, and convey the substrate $P_{(n)}$ to the support rollers 19b of the next vacuum deaerating portion 19. As the substrate $P_{(n)}$ enters into the vacuum chamber 19A, the lid of the vacuum chamber 19A is closed, and the deaeration process is performed under a vacuum atmosphere.

As the vacuum deaeration process is completed in the step s11, the lid of the vacuum chamber 19A is opened. The conveyance claws 32 slide, and the claw portions 32a enter into the vacuum deaerating portion 19. The shaft portions 32b slide until the claw portions 32a are placed in the vicinity of the upstream end inside the vacuum chamber 19A. Then, the shaft portions 32b respectively rotate, and the claw portions 32a support the rear end of the substrate $P_{(n)}$. The claw portions 32a press the rear end of the substrate $P_{(n)}$ and convey the substrate $P_{(n)}$ to the conveyance chains 33a of the cooling portion 30. If the operation of pressing the substrate $P_{(n)}$ using the claw portions 32a is completed, the shaft portions 32b respectively rotate, and the claw portion 32a avoids the substrate $P_{(n)}$.

In the step s12, the substrate $P_{(n)}$ conveyed to the cooling portion 30 is cooled. In this case, the conveyance chains 33a are not driven.

In the step s13, the claw portions 32e of the conveyance claws 32 support the rear end of the substrate $P_{(n)}$ and push the substrate $P_{(n)}$ to the conveyance path 43D of the substrate discharge portion 16. In this case, the substrate $P_{(n)}$ may be pushed to the conveyance path 43D of the substrate discharge portion 16 using the conveyance chains 33a instead of the claw portions 32e of the conveyance claws 32. The substrate $P_{(n)}$ conveyed to the conveyance path 43D using the claw portions 32e of the conveyance claws 32 or the conveyance chains 33a is conveyed using the conveyance path 43D of the substrate discharge portion 16 and is discharged from the substrate discharge outlet 12 to the outside of the soldering apparatus 100.

Figure 8:
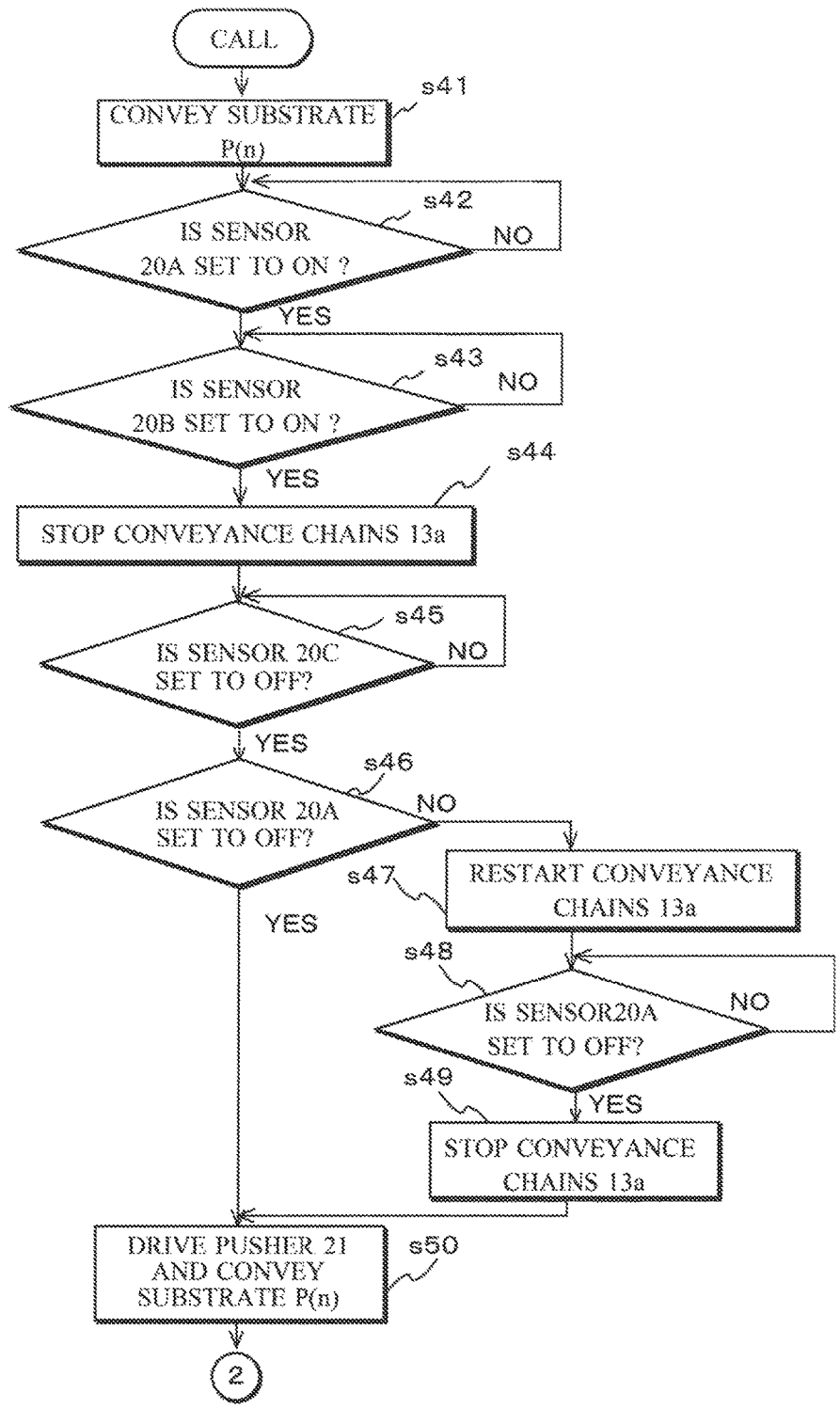
FIG. 8 is a flowchart illustrating the operation example of the soldering apparatus 100.
Figure 9:
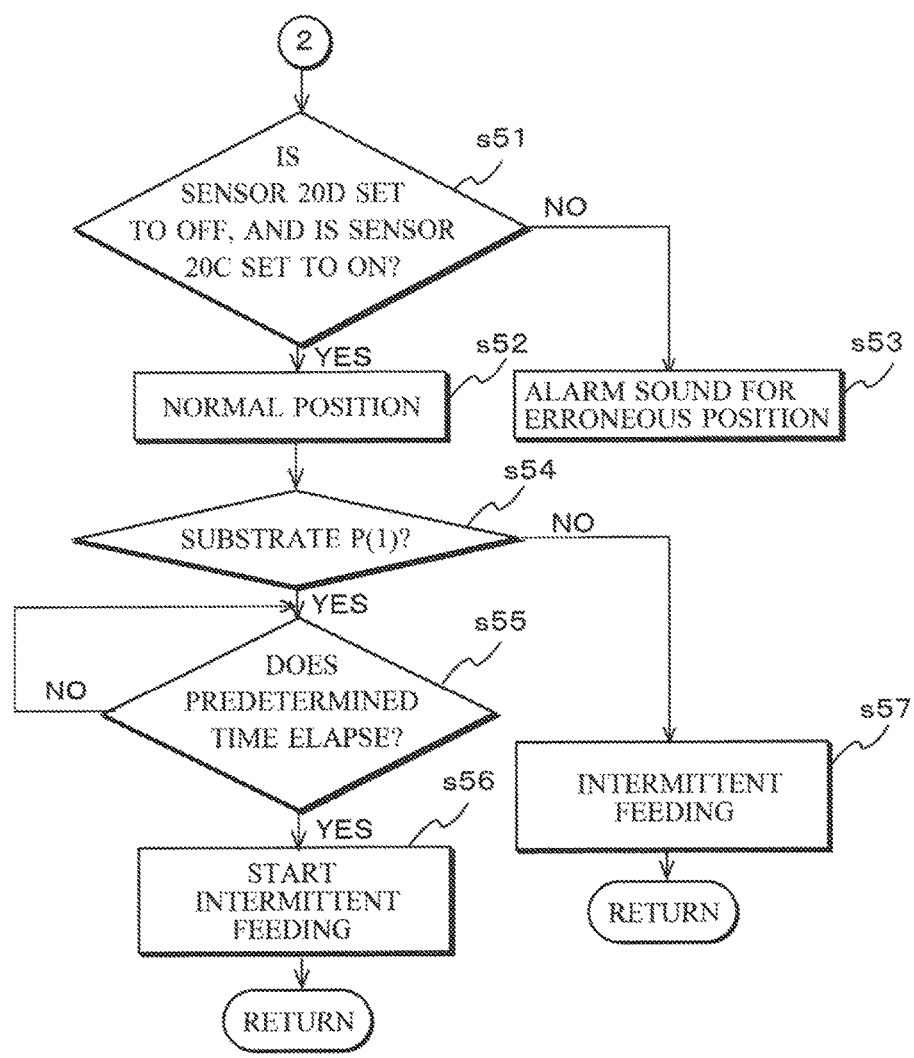
FIG. 9 is a flowchart illustrating the operation example of the soldering apparatus 100.

Subsequently, the operation control for the conveyance paths 13A and 23B using the controller 70 in the above-mentioned steps s4 to s7 will be described in details with reference to FIGS. 8 and 9.

At a step s41, the chain drive portions 13f and 43f are driven to move the conveyance chains 13a and 43a. The pusher 21 stops. In this case, if the substrate $P_{(n)}$ is the first one, a substrate $P_{(n-1)}$ preceding the substrate $P_{(n)}$ is not loaded, and all of the sensors 20A to 20D are set to OFF. The conveyance chains 13a convey the substrate $P_{(n)}$.

At a step s42, when a front end of the substrate $P_{(n)}$ reaches the substrate reference position P1, the sensor 20A is set to ON.

The conveyance chains 13a further convey the substrate $P_{(n)}$.

At a step s43, when the front end of the substrate $P_{(n)}$ reaches the substrate reference position P2, the sensor 20B is set to ON.

At a step s44, as the sensor 20B is set to ON, the conveyance chains 13a stop, so that conveyance of the substrate $P_{(n)}$ stops. That is, the controller 70 stops the conveyance chains 13a to stop conveyance of the substrate $P_{(n)}$ when it is determined that the sensor 20B is set to ON.

At a step s45, the controller 70 checks the ON/OFF state of the sensor 20C. When the sensor 20C is set to ON, it is determined that a preceding substrate $P_{(n-1)}$ is placed in the vicinity of the upstream end of the conveyance path 23B, and conveyance of the substrate $P_{(n)}$ stops until the substrate $P_{(n-1)}$ is conveyed and the sensor 20C is set to OFF. When the sensor 20C is set to OFF, it is determined that there is no preceding substrate $P_{(n-1)}$ in the vicinity of the upstream end of the conveyance path 23B, and the process advances to a step s46. Note that the sensor 20C is set to OFF because there is no preceding substrate $P_{(n-1)}$ even when the substrate $P_{(n)}$ is the first one $P_{(1)}$.

At the step s46, the controller 70 checks the ON/OFF state of the sensor 20A. When the sensor 20A is set to ON, the controller 70 determines that the substrate $P_{(n)}$ is placed in a position where the substrate $P_{(n)}$ is not pressed by the pusher 21, and the process advances to a step s47. When the sensor 20A is set to OFF, the controller 70 determines that the substrate $P_{(n)}$ is placed in a position where the substrate $P_{(n)}$ is pressed by the pusher 21, and the process advances to a step s50.

At the step s47, if it is determined that the substrate $P_{(n)}$ is placed in a position where the substrate $P_{(n)}$ is not pressed by the pusher 21, the controller 70 restarts driving of the conveyance chains 13a.

At a step s48, the controller 70 checks the ON/OFF state of the sensor 20A. The controller 70 continuously drives the conveyance chains 13a until the sensor 20A is set to OFF.

At a step s49, when the substrate $P_{(n)}$ is conveyed by the conveyance chains 13a and the sensor 20A is set to OFF, the controller 70 stops the conveyance chains 13a again to stop conveyance of the substrate $P_{(n)}$.

At the step s50, the controller 70 drives the pusher 21. The pusher 21 presses the rear end of the substrate $P_{(n)}$ to push the substrate $P_{(n)}$ from the conveyance path 13A to the conveyance chains 23a of the conveyance path 23B.

At a step s51, the pusher 21 pushes the substrate $P_{(n)}$. When a front end of the substrate $P_{(n)}$ passes through the sensor 20D and is placed in the substrate reference position P3 of the sensor 20C, the sensors 20D and 20C are set to ON together. A position of the substrate $P_{(n)}$ conveyed by the pusher 21 at a constant stroke becomes the substrate standby position A of the intermittent feeding start portion 31, which is the normal position. This substrate standby position A is a position immediately after the rear end of the substrate $P_{(n)}$ passes through the sensor 20D. Therefore, the controller 70 determines whether or not the sensor 20D is set to OFF, and the sensor 20C is set to ON.

At a step s52, if it is checked that the sensor 20D is set to OFF and the sensor 20C is set to ON, the controller 70 determines that the substrate $P_{(n)}$ is placed in the substrate standby position A which is the normal position.

On the other hand, at a step s53, if the sensor 20D is not set to OFF and the sensor 20C is not set to ON even when the pusher 21 is driven in the step s46, it is considered that the substrate $P_{(n)}$ is placed in an erroneous position, and the operator is notified of abnormality using an alarm sound or the like.

At a step s54, the controller 70 determines whether or not the substrate $P_{(n)}$ conveyed to the substrate standby position A is the first one.

The steps s52 and s54 correspond to the step s5 of FIG. 7A and are performed while the substrate $P_{(n)}$ is suspended in the substrate standby position A. In addition, the step s53 is also performed while the substrate $P_{(n)}$ is suspended.

At a step s55, if the substrate $P_{(n)}$ conveyed to the substrate standby position A is the first one, the controller 70 determines whether or not a predetermined time elapses after the first substrate $P_{(1)}$ conveyed to the intermittent feeding start portion 31 of the intermittent feeding unit 15 is conveyed. This step s55 corresponds to the step s6 of FIG. 7A.

This predetermined time serves as a reference of the intermittent feeding operation. Then, clocking is continuously performed regardless of whether or not there is a substrate in the substrate standby position A of the intermittent feeding start portion 31 until the operation of the soldering apparatus 100 stops.

At a step s56, after a predetermined time elapses, the substrate $P_{(1)}$ is conveyed in an intermittent feeding manner in steps subsequent to the step s7 of FIG. 7A.

At a step s57, when the substrate $P_{(n)}$ conveyed to the substrate standby position A is not the first one, the substrate $P_{(n)}$ conveyed to the substrate standby position A is conveyed in an intermittent feeding manner in steps subsequent to the step s7 of FIG. 7A in synchronization with the timing of each clocking that has started already.

Note that, if the pusher 21 pushes the substrate $P_{(n)}$ until the rear end of the substrate $P_{(n)}$ is placed on the conveyance chains 23a in the step s50, the pusher 21 returns to its initial position. The chain drive portions 13f are driven again, so that the conveyance chains 13a start to move. In this step, the operator may place the next substrate $P_{(n+1)}$ on the conveyance chains 13a. Note that, if a substrate supply device for sequentially supplying substrates as a soldering target or a flux applying device (not shown) is provided in a front stage of the soldering apparatus 100, it may be detected that the pusher 21 returns to its initial position, and the substrate may be conveyed to the soldering apparatus from the substrate supply device or the flux applying device in response to this detection signal.

In the soldering apparatus 100, the intermittent feeding operation of the substrate $P_{(n)}$ loaded on the substrate loading portion 14 can be controlled depending on whether or not the sensor 20C detects an immediately preceding substrate $P_{(n-1)}$ loaded on the conveyance apparatus.

Figure 10:
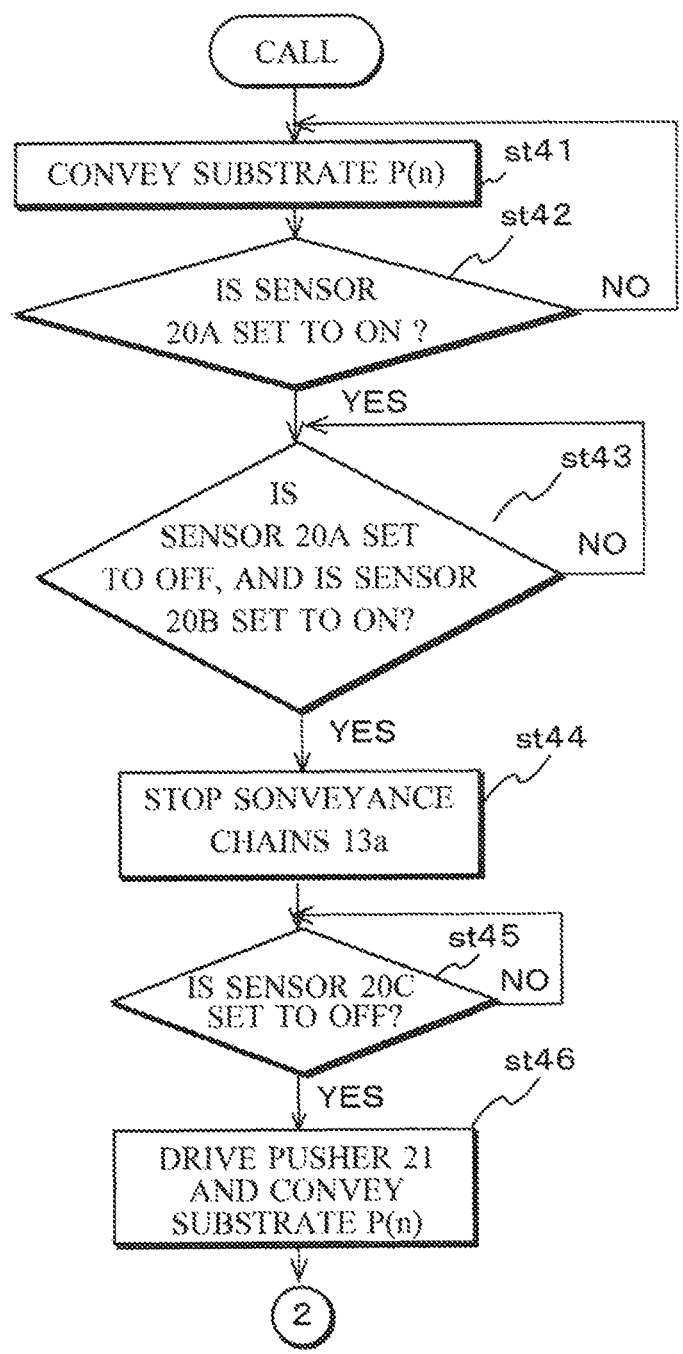
FIG. 10 is a flowchart illustrating another operation example of the soldering apparatus 100.

Note that FIG. 10 illustrates another operation example of the soldering apparatus 100. In this operation example, the steps s41 to s50 of FIG. 8 is changed to steps st41 to st46. This operation example may be applied to a case where the length of the substrate is shorter than a distance between the sensors 20A and 20B, and conveyance of the substrate is performed in synchronization with the ON/OFF operation of the sensors 20A and 20B. The operation control of the conveyance paths 13A and 23B using the controller 70 in the steps st41 to st46 of FIG. 10 will now be described in details.

At the step st41, the chain drive portions 13f and 43f are driven, and the conveyance chains 13a and 43a move. In addition, the pusher 21 stops. In this case, if the substrate $P_{(n)}$ is the first one, the substrate $P_{(n-1)}$ preceding the substrate $P_{(n)}$ is not loaded, and all of the sensors 20A to 20D are set to OFF. The conveyance chains 13a convey the substrate $P_{(n)}$.

At the step st42, when the front end of the substrate $P_{(n)}$ reaches the substrate reference position P1, the sensor 20A is set to ON.

The conveyance chains 13a further convey the substrate $P_{(n)}$.

At the step st43, when the front end of the substrate $P_{(n)}$ reaches the substrate reference position P2, the sensor 20B is set to ON. If the sensor 20A is still set to ON, the substrate $P_{(n)}$ is further conveyed until the sensor 20A is set to OFF.

At the step st44, when the sensor 20B is set to ON and the sensor 20A is set to OFF, the conveyance chains 13a stop, and conveyance of the substrate $P_{(n)}$ stops. That is, if it is determined that the sensor 20A is set to OFF and the sensor 20B is set to ON, the controller 70 stops the conveyance chains 13a to stop conveyance of the substrate $P_{(n)}$.

At the step st45, the controller 70 checks the ON/OFF state of the sensor 20C. When the sensor 20C is set to ON, it is determined that there is a preceding substrate $P_{(n-1)}$ in the vicinity of the upstream end of the conveyance path 23B, and the controller 70 stops conveyance of the substrate $P_{(n)}$ until the substrate $P_{(n-1)}$ is conveyed, and the sensor 20C is set to OFF.

At the step st46, when there is no preceding substrate $P_{(n-1)}$ in the vicinity of the upstream end of the conveyance path 23B and the sensor 20C is set to OFF, the controller 70 determines that the substrate $P_{(n)}$ is pressed by the pusher 21. Even when the substrate $P_{(n)}$ is the first one $P_{(1)}$, the sensor 20C is set to OFF, and the controller 70 determines that the substrate $P_{(n)}$ is pressed by the pusher 21 because there is no preceding substrate. The controller 70 drives the pusher 21. The pusher 21 presses the rear end of the substrate $P_{(n)}$ and pushes the substrate $P_{(n)}$ from the conveyance path 13A to the conveyance chains 23a of the conveyance path 23B. As the pusher 21 pushes the rear end of the substrate $P_{(n)}$, the processes subsequent to step s51 of FIG. 9 are performed.

Note that the operation example of the soldering apparatus 100 is not limited to those described above. Various conveyance patterns may be set on the basis of the ON/OFF state of the sensors 20A to 20D depending on a length of the substrate. In addition, although the sensor 20D is provided to reliably detect whether or not the substrate $P_{(n)}$ conveyed to the intermittent feeding start portion 31 is placed in the substrate standby position A, the effects of the invention may also be obtained even by omitting the sensor 20D.

Note that, although the soldering apparatus 100 that solders the substrate $P_{(n)}$ has been described by way of example in the above embodiment, the conveyance apparatus according to the invention is not limited to the soldering apparatus 100. For example, the conveyance apparatus according to the invention may be applied to a conveyance apparatus that intermittently feeds substrates, such as a jut soldering device or a flux applying device. In addition, although the vacuum deaerating portion 19 has the vacuum chamber 19A for vacuum deaeration according to the above embodiment, the invention is not limited thereto.

INDUSTRIAL APPLICABILITY

The invention may be applied to a conveyance apparatus that conveys substrates. In particular, the invention is preferably applied to a soldering apparatus that solders the substrates.

It is to be noted that any technical scope of the claims and/or meaning of term(s) claimed in the claims are not limited to the description in the above-mentioned embodiments. It should be understood by those skilled in the art that various modifications, combinations, sub-combinations and alterations may occur depending on design requirements and other factors insofar as they are within the scope of the appended claims or the equivalents thereof.

The invention claimed is:

1. A conveyance apparatus that conveys a substrate, comprising:
   a substrate loading portion configured to load the substrate on the conveyance apparatus;
   an intermittent feeding unit configured to intermittently feed the substrate loaded on the conveyance apparatus;
   a substrate discharge portion configured to discharge the intermittently fed substrate to the outside of the conveyance apparatus; and
   a controller configured to control conveyance of the substrate, said substrate loading portion, said intermittent feeding unit, said substrate discharge portion being arranged from an upstream side to a downstream side along a substrate conveyance direction,
   wherein the substrate loading portion having a substrate loading inlet includes
      a first conveyance path configured to convey the substrate;
      a first sensor provided in the vicinity of the substrate loading inlet thereof, and
      a second sensor arranged in a downstream side of the first sensor along the substrate conveyance direction, and
   wherein the intermittent feeding unit having an upstream end along the substrate conveyance direction includes
      a second conveyance path for conveying the substrate, and
      a third sensor placed in the vicinity of the upstream end thereof
   wherein when the second sensor detects the substrate conveyed on the first conveyance path, the third sensor does not detect a substrate which precedes the substrate, and the first sensor detects the substrate,
   the controller continues conveyance of the substrate until the substrate is no longer detected by the first sensor.

2. The conveyance apparatus according to claim 1, wherein the conveyance apparatus further comprises a pusher configured to push the substrate conveyed on the first conveyance path to the second conveyance path, and
   wherein, when the first sensor does not detect the substrate conveyed on the first conveyance path, the second sensor detects the substrate, and the third sensor does not detect the substrate which precedes the substrate, the controller drives the pusher.

3. The conveyance apparatus according to claim 1, wherein the intermittent feeding unit includes a fourth sensor placed in an upstream side of the third sensor along the substrate conveyance direction, and
   the controller determines that the substrate is placed in a normal position when the third sensor detects the substrate, and the fourth sensor does not detect the substrate.

4. The conveyance apparatus according to claim 1, wherein the intermittent feeding unit includes a pair of conveyance claws configured to press the substrate.

5. The conveyance apparatus according to claim 1, wherein the intermittent feeding unit includes a third conveyance path in a downstream side of the second conveyance path along the substrate conveyance direction, and
   the substrate discharge portion includes a fourth conveyance path.

6. The conveyance apparatus according to claim 1, wherein the intermittent feeding unit includes at least a chamber for performing a process in a sealed space.

7. The conveyance apparatus according to claim 1, wherein the intermittent feeding unit includes
   a pre-heating portion configured to pre-heat the substrate,
   a main heating portion configured to solder the pre-heated substrate,
   a vacuum deaerating portion having a vacuum chamber for vacuum deaeration for the soldered substrate, and
   a cooling portion configured to cool the substrate subjected to the vacuum deaeration.

8. A conveyance apparatus that conveys a substrate, comprising:
   a substrate loading portion configured to load the substrate on the conveyance apparatus;
   an intermittent feeding unit configured to intermittently feed the substrate loaded on the conveyance apparatus;
   a substrate discharge portion configured to discharge the intermittently fed substrate to the outside of the conveyance apparatus; and
   a controller configured to control conveyance of the substrate, said substrate loading portion, said intermittent feeding unit, said substrate discharge portion being arranged from an upstream side to a downstream side along a substrate conveyance direction,
   wherein the substrate loading portion having a substrate loading inlet includes
      a first conveyance path configured to convey the substrate;
      a first sensor provided in the vicinity of the substrate loading inlet thereof, and
      a second sensor arranged in a downstream side of the first sensor along the substrate conveyance direction,
   wherein the intermittent feeding unit having an upstream end along the substrate conveyance direction includes
      a second conveyance path for conveying the substrate, and
      a third sensor placed in the vicinity of the upstream end thereof, and the conveyance apparatus further comprises:
   a pusher configured to push the substrate conveyed on the first conveyance path to the second conveyance path,
   wherein when the second sensor detects the substrate conveyed on the first conveyance path, and the third sensor detects a substrate which is preceded by the substrate,
   the controller suspends conveyance of the substrate,
   wherein when the first sensor does not detect the substrate conveyed on the first conveyance path, the second sensor detects the substrate, and the third sensor does not detect a preceding substrate out of the substrates conveyed by the conveyance apparatus, and
   the controller drives the pusher.

9. The conveyance apparatus according to claim 8, wherein the intermittent feeding unit includes a pair of conveyance claws configured to press the substrate.

10. The conveyance apparatus according to claim 8, wherein the intermittent feeding unit includes a third conveyance path in a downstream side of the second conveyance path along the substrate conveyance direction, and
the substrate discharge portion includes a fourth conveyance path.

11. The conveyance apparatus according to claim 8, wherein the intermittent feeding unit includes a fourth sensor placed in an upstream side of the third sensor along the substrate conveyance direction, and
the controller determines that the substrate is placed in a normal position when the third sensor detects the substrate, and the fourth sensor does not detect the substrate.

12. The conveyance apparatus according to claim 8, wherein the intermittent feeding unit includes at least a chamber for performing a process in a sealed space.

13. The conveyance apparatus according to claim 8, wherein the intermittent feeding unit includes
a pre-heating portion configured to pre-heat the substrate,
a main heating portion configured to solder the pre-heated substrate,
a vacuum deaerating portion having a vacuum chamber for vacuum deaeration for the soldered substrate, and
a cooling portion configured to cool the substrate subjected to the vacuum deaeration.

14. A conveyance apparatus that conveys a substrate, comprising:
a substrate loading portion configured to load the substrate on the conveyance apparatus;
an intermittent feeding unit configured to intermittently feed the substrate loaded on the conveyance apparatus;
a substrate discharge portion configured to discharge the intermittently fed substrate to the outside of the conveyance apparatus; and
a controller configured to control conveyance of the substrate, said substrate loading portion, said intermittent feeding unit, said substrate discharge portion being arranged from an upstream side to a downstream side along a substrate conveyance direction,
wherein the substrate loading portion having a substrate loading inlet includes
a first conveyance path configured to convey the substrate;
a first sensor provided in the vicinity of the substrate loading inlet thereof, and
a second sensor arranged in a downstream side of the first sensor along the substrate conveyance direction, and
wherein the intermittent feeding unit having an upstream end along the substrate conveyance direction includes
a second conveyance path for conveying the substrate, and
a third sensor placed in the vicinity of the upstream end thereof,
wherein, when the second sensor detects the substrate conveyed on the first conveyance path, and the third sensor detects a substrate which precedes the substrate, the controller suspends conveyance of the following substrate,
wherein when the second sensor detects the substrate conveyed on the first conveyance path, the third sensor does not detect a substrate which precedes the substrate, and the first sensor detects the substrate,
the controller continues conveyance of the substrate until the substrate is no longer detected by the first sensor.

15. The conveyance apparatus according to claim 14, wherein the intermittent feeding unit includes a pair of conveyance claws configured to press the substrate.

16. The conveyance apparatus according to claim 14, wherein the intermittent feeding unit includes a third conveyance path in a downstream side of the second conveyance path along the substrate conveyance direction, and
the substrate discharge portion includes a fourth conveyance path.

17. The conveyance apparatus according to claim 14, wherein the conveyance apparatus further comprises a pusher configured to push the substrate conveyed on the first conveyance path to the second conveyance path, and
wherein, when the first sensor does not detect the substrate conveyed on the first conveyance path, the second sensor detects the substrate, and the third sensor does not detect the substrate which precedes the substrate, the controller drives the pusher.

18. The conveyance apparatus according to claim 14, wherein the intermittent feeding unit includes a fourth sensor placed in an upstream side of the third sensor along the substrate conveyance direction, and
the controller determines that the substrate is placed in a normal position when the third sensor detects the substrate, and the fourth sensor does not detect the substrate.

19. The conveyance apparatus according to claim 14, wherein the intermittent feeding unit includes at least a chamber for performing a process in a sealed space.

20. The conveyance apparatus according to claim 14, wherein the intermittent feeding unit includes
a pre-heating portion configured to pre-heat the substrate,
a main heating portion configured to solder the pre-heated substrate,
a vacuum deaerating portion having a vacuum chamber for vacuum deaeration for the soldered substrate, and
a cooling portion configured to cool the substrate subjected to the vacuum deaeration.

* * * * *